United States Patent
Möckel et al.

(10) Patent No.: US 6,773,934 B2
(45) Date of Patent: Aug. 10, 2004

(54) METHOD FOR RELEASABLE CONTACT-CONNECTION OF A PLURALITY OF INTEGRATED SEMICONDUCTOR MODULES ON A WAFER

(75) Inventors: Jens Möckel, München (DE); Gerrit Färber, München (DE); Martin Fritz, München (DE); Frank Weber, Kraiburg A. Inn (DE); Michael Hübner, Schönau (DE)

(73) Assignee: Infineon Technologies AG, Munich (DE)

( * ) Notice: Subject to any disclaimer, the term of this patent is extended or adjusted under 35 U.S.C. 154(b) by 132 days.

(21) Appl. No.: 10/105,590

(22) Filed: Mar. 25, 2002

(65) Prior Publication Data

US 2002/0137238 A1 Sep. 26, 2002

(30) Foreign Application Priority Data

Mar. 23, 2001 (DE) .......................... 101 14 291

(51) Int. Cl.[7] .............................................. H01L 21/66
(52) U.S. Cl. ......................................... 438/14; 438/612
(58) Field of Search .......................... 438/14, 612, 613, 438/614

(56) References Cited

U.S. PATENT DOCUMENTS

| 4,894,605 | A | 1/1990 | Ringleb et al. |
| 5,072,175 | A | 12/1991 | Marek |
| 5,815,001 | A | 9/1998 | Michael |
| 6,100,710 | A | 8/2000 | Monnot |
| 6,476,630 | B1 | * 11/2002 | Whitten et al. ............. 324/765 |
| 6,525,555 | B1 | * 2/2003 | Khandros et al. ........... 324/765 |

* cited by examiner

Primary Examiner—Caridad Everhart
(74) Attorney, Agent, or Firm—Laurence A. Greenberg; Werner H. Stemer; Gregory L. Mayback

(57) ABSTRACT

A method for releasable contact-connection of a plurality of integrated semiconductor modules on a wafer, each of which having a plurality of interconnected supply voltage terminals, includes the steps of providing a contacting card for applying external electrical signals to the semiconductor modules with contact elements for releasable electrical connection to terminal pads of the semiconductor modules, aligning the contacting card with the wafer, producing a releasable contact between terminal pads of the plurality of semiconductor modules and the contact elements of the contacting card, checking the contact quality for each of the semiconductor modules by applying a voltage to at least one of the supply voltage terminals of the semiconductor module through the contacting card, measuring the voltage present at a further one of the supply voltage terminals through the contacting card, and using the measurement result to assess whether or not the semiconductor module has correct contact.

26 Claims, 3 Drawing Sheets

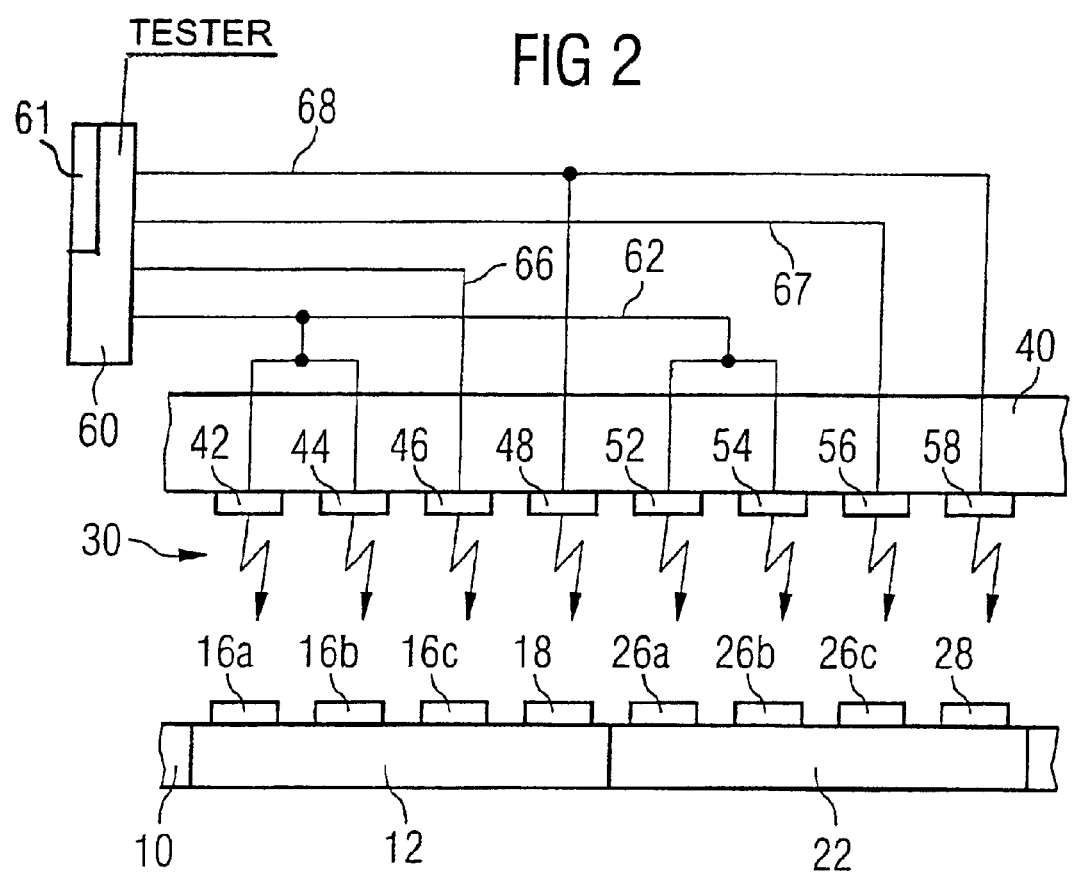

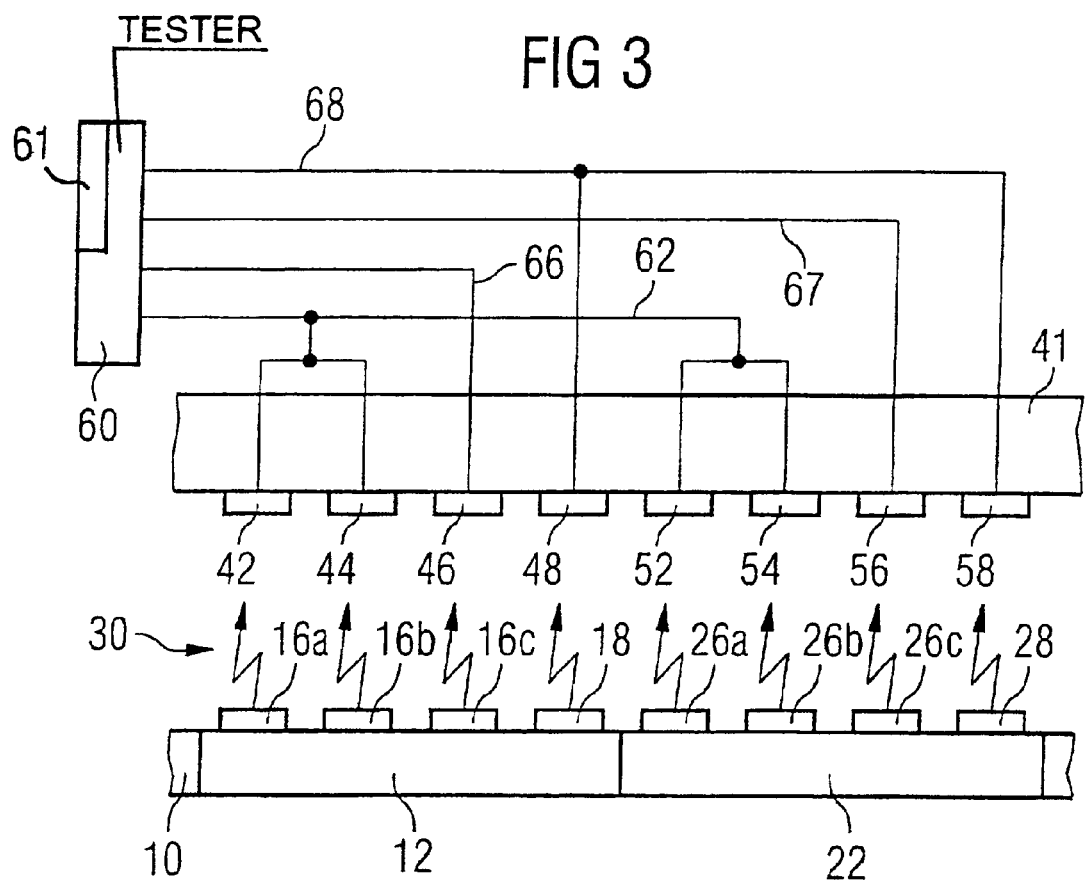

METHOD FOR RELEASABLE CONTACT-CONNECTION OF A PLURALITY OF INTEGRATED SEMICONDUCTOR MODULES ON A WAFER

BACKGROUND OF THE INVENTION

Field of the Invention:

The present invention lies in the field of integrated circuits and relates to a method for releasable contact-connection of a plurality of integrated semiconductor modules on a wafer, the semiconductor modules each having a plurality of interconnected supply voltage terminals.

After their production, semiconductor components are usually subjected to a series of functional tests in order to increase the yield of functional components. For many applications, the most economic procedure for identifying and, if appropriate, also repairing defects is for the procedure to be effected whilst still on the wafer, that is to say, before the modules are separated and housed.

Likewise, a so-called burn-in is often carried out for semiconductor components, in which the components are aged before use in a targeted manner by the manufacturer to reduce the failure rate of the components supplied to the customers to an approximately constant low value compared with the initial failure rate. Here, too, it is desirable if such a burn-in can be carried out simultaneously for as many components as possible at the wafer level.

The drive system used for a module test or for a burn-in is referred to uniformly below as test system, without restricting the generality. The connection between the test system and the components on the wafer is produced by a contacting card, for example, a needle card. In such a case, the majority of the contact-connecting needles serve for transmitting test, data, and control signals from the test system to the module to be tested. Further contact-connecting needles connected to a voltage source carry one or more supply voltages, for example, with a level of 3.3 V or 2.5 V, to corresponding pads of the semiconductor module.

The aim, both in the module test and in the burn-in, is for the components of the largest possible part of the wafer, preferably of the entire wafer, to be contact-connected simultaneously. Due to the large number of components on the wafer and the limited number of system channels available on the test system for driving the components, a parallel circuit of a plurality of components is required for such a purpose. This means that the same electrical signal is provided only once by the test system and applied to corresponding terminals of a plurality of components.

In such a case, however, the problem arises that previous methods for verifying the quality of the contact between contacting card and components no longer yield satisfactory results. In the prior art methods, one channel of the test unit is connected to exactly one component terminal. A current is impressed on the connecting line and the voltage drop across the input protection diodes of the component terminal is measured. If the voltage drop lies in the range around the typical value of 0.6 V, for example, then the contact is identified as defect-free.

In the case of parallel contact-connection of a plurality of components, however, it is no longer possible to see from the measured voltage drop whether or not all of the components driven in parallel have adequate contact because there is no longer an unambiguous assignment between the output signal and the tested component.

European Patent 0733 910 B1, corresponding to U.S. Pat. No. 5,815,001 to Ewald, describes a method for carrying out a contact check of a plurality of integrated circuits mounted on a circuit board, the integrated circuits having not only the basic configuration but also a test configuration that, when test signals are present at first terminals of the circuit, transmits corresponding result signals to second terminals of the circuit.

U.S. Pat. No. 6,100,710 to Monnot discloses a method for checking the contact of an integrated semiconductor circuit with two different ground terminals.

A further method for carrying out a contact check of a plurality of integrated circuits mounted on a circuit board is disclosed in U.S. Pat. No. 5,072,175 to Marek. In Marek, a dedicated test diode is provided for each circuit and for each terminal.

SUMMARY OF THE INVENTION

It is accordingly an object of the invention to provide a method for releasable contact-connection of a plurality of integrated semiconductor modules on a wafer that overcomes the hereinafore-mentioned disadvantages of the heretofore-known devices and methods of this general type and that checks releasable contacts on a plurality of integrated semiconductor modules of the type mentioned above and enables reliable checking of the contact quality.

With the foregoing and other objects in view, there is provided, in accordance with the invention, a method for checking releasable contacts of integrated semiconductor modules on a wafer, the semiconductor modules each having interconnected supply voltage terminals including the steps of connecting the contacts of a semiconductor module on the wafer in parallel with a contacting card, applying a supply voltage to a first one of the supply voltage terminals of the semiconductor module through the contacting card, measuring a voltage present at a second one of the supply voltage terminals of the semiconductor module through the contacting card, comparing the voltage applied to the first supply voltage terminal with the voltage measured at the second supply voltage terminal, and evaluating a contact status for the semiconductor module as being correct if the voltage measured at the second supply voltage terminal substantially corresponds to the voltage applied to the first supply voltage terminal, and otherwise as being incorrect.

The invention is, thus, based on the concept of using the interconnected supply voltage terminals of the semiconductor modules for the contact test by applying to at least one of these terminals a voltage whose presence at another one of the supply voltage terminals serves as verification of a correct contact.

The method of the invention can be realized at any time without appreciable additional technical outlay. The assessment of the contact quality using a single measurement per component is based on the observation that although the quality of contacts can change extensively over the entire wafer, it, nonetheless, scarcely varies locally over the area of an individual component. Therefore, it is highly likely that a poor contact on one component will also appear at the measured supply voltage terminal. Consequently, the proposed contact test provides a good general statement about the quality of the contact-connection and can also be effected independently of a complicated test system beforehand in a separate, simple contact test station.

The assessment of the measurement results for all the checked semiconductor modules is preferably conducted for evaluation to ascertain whether or not there is a correct contact between wafer and contacting card.

In accordance with another mode of the invention, the evaluation of the semiconductor module is indicated with an indication device.

In accordance with a further mode of the invention, the connecting, applying, measuring, comparing, and evaluating steps are repeated for each of the semiconductor modules.

In accordance with an added mode of the invention, the evaluation of the semiconductor modules is simultaneously indicated with an indication device. Preferably, all of the semiconductor modules are simultaneously indicated.

In accordance with an additional mode of the invention, a result of the evaluation for a given semiconductor module is indicated with a representation indicating a position of the respective semiconductor module on the wafer.

In accordance with yet another mode of the invention, a result of the evaluation for all of the semiconductor modules is simultaneously indicated with a representation indicating a position of each respective semiconductor module on the wafer.

In accordance with yet a further mode of the invention, the releasable electrical connection between the terminal pads of the semiconductor modules and the contacting card is formed by intermediate elements disposed on the contact elements of the contacting card, in particular, by contact-connecting needles.

In accordance with yet an added mode of the invention, the releasable electrical connection between the terminal pads of the semiconductor modules and the contacting card is formed by intermediate elements disposed on the terminal pads of the semiconductor modules, in particular, by contact-connecting needles.

In accordance with yet an additional mode of the invention, for checking quality of the contact, a voltage corresponding to the supply voltage is expediently applied to the supply voltage terminals.

In accordance with a concomitant mode of the invention, the voltage present at a further one of the supply voltage terminals is preferably measured substantially in currentless fashion through a read contact-connecting needle or another read intermediate element. In such a case, a currentless read connection is understood to be a connection in which, for determining the potential, such a small measurement current is impressed that voltage drops along the read line have only an insignificant influence on the result.

The invention also provides a contacting card for carrying out the abovementioned method. The contacting card includes contact elements for producing a releasable contact with terminal pads of the semiconductor modules, first contact elements being constructed to apply a voltage to at least one of the supply voltage terminals of the semiconductor modules, and second contact elements being constructed to measure the voltage present at a further one of the supply voltage terminals. In such a case, either the contact elements of the contacting card or the terminal pads of the semiconductor modules may have contact-connecting needles or other intermediate elements for producing the releasable contact.

Other features that are considered as characteristic for the invention are set forth in the appended claims.

Although the invention is illustrated and described herein as embodied in a method for releasable contact-connection of a plurality of integrated semiconductor modules on a wafer, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a fragmentary block circuit diagram of an embodiment of the testing device according to the invention; and FIG. 3 a fragmentary block circuit diagram of an alternative embodiment of the testing device of FIG. 2.

DESCRIPTION OF THE PREFERRED EMBODIMENTS

Figure 1A:
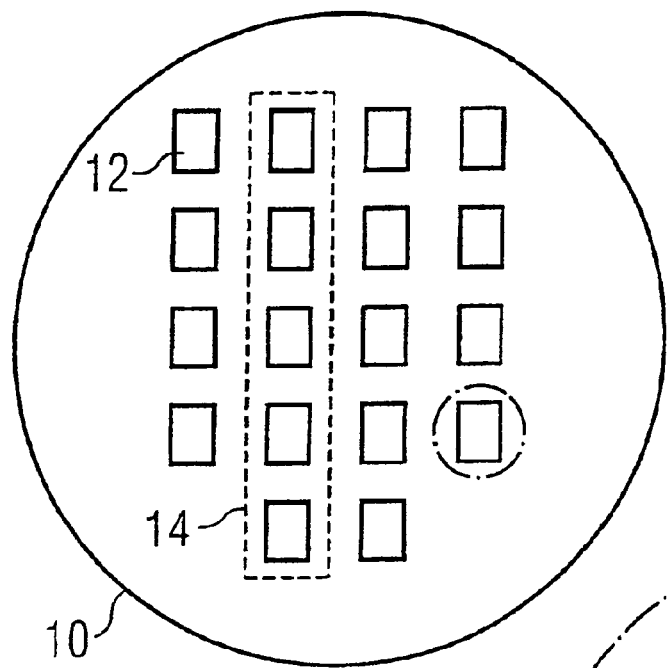
FIG. 1A is a diagrammatic illustration of a wafer with a plurality of components to be tested according to the invention.
Figure 1B:
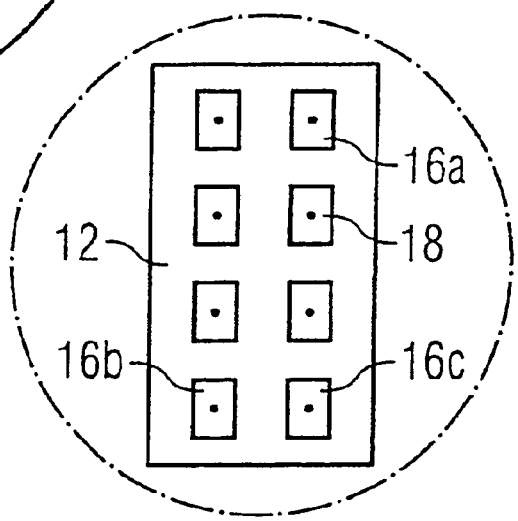
FIG. 1B is an exploded view of a portion of the wafer of FIG. 1A.

Referring now to the figures of the drawings in detail and first, particularly to FIGS. 1A and 1B thereof, there is shown a wafer 10 containing a multiplicity of identical components 12, for example, DRAM memory elements. Each of the components 12 has a series of terminal pads 16a–c, 18 for the supply voltage Vcc, ground GND, and data and control signals, only some of which are illustrated by way of example in FIG. 1B. In such a case, the supply voltage Vcc is generally present at a plurality of terminal pads 16a–c that are connected to one another on-chip.

During the testing of all the components of the entire wafer 10, each of the components 12 and 22 is contact-connected through a contacting card 40. See FIG. 2. Because the test system 60 (FIG. 2) only has a limited number of system channels, a plurality of modules (for example, 8, 16, or 32) is driven simultaneously with the same signals of the test system. A group of such simultaneously driven components is indicated by the border 14 in FIG. 1A.

The diagrammatic illustration of FIG. 2 shows the wafer 10 and a needle card 40 shortly before the production of the contact. The components 12 and 22 disposed on the wafer 10 (and, generally, further components not illustrated in FIG. 2) are tested simultaneously by the test system 60. The test system 60 provides, inter alia, a supply voltage for the components on line 62 and test, control, and data signals on further lines, of which only one line 68 is illustrated by way of example.

A line 68 connects the associated terminal of the test system 60 to the terminals 48, 58 of the needle card 40, which, after the production of the releasable contact with the wafer, are connected to the terminal pads 18, 28 of the components 12, 22. The module test or a burn-in can then take place through these connections.

The releasable contact between the needle card 40 and the component terminals is achieved by mechanically partially flexible contact-connecting needles 30 that produce a mechanically stable and re-contact-connectable electrical connection to components 12, 22, which connection is suitable for high frequencies.

Each component 12 (or 22) has a plurality of supply voltage terminals 16a–c (or 26a–c) that are connected to one another on-chip through interconnects, so that, by applying the supply voltage to different locations of the component, a more uniform distribution of the supply voltage over the chip area is obtained.

The supply voltage 62 for the components 12, 22 is then applied through the terminals 42, 44 and 52, 54 of the needle card not to all the supply voltage terminals but rather only to the supply voltage terminals 16a and 16b and, respectively, 26a and 26b.

The terminals 16c and 26c, which are likewise connected to the other supply voltage terminals, are utilized as read terminals for measuring the voltage present at the component. To that end, the voltage present at the terminals 16c, 26c is measured in currentless fashion in each case through a read contact-connecting needle, a needle card terminal 46 and 56, respectively, and read lines 66 and 67, respectively, and is recorded by the test unit 60.

If the component 12 has good contact with the needle card, then the voltage measured at the terminal 16c corresponds to the supply voltage applied to the terminals 16a, 16b except for the voltage drops that occur on-chip and those that occur along the connection to the test unit. The same applies to the component 22 and all further components that, in practice, are contact-connected simultaneously with the components 12 and 22.

As shown in the embodiment of FIG. 3, the contact-connecting needles 30 can also be provided at the terminal pads of the components 12, 22 instead of at the terminals of the contacting card 41. After contact has been made between contacting card 41 and wafer 10, the contact test proceeds in the manner described above in this embodiment as well.

In the embodiments of FIGS. 2 and 3, the test unit 60 receives a feedback message about the quality of the contact in a simple manner from each of the simultaneously contact-connected components. The information as to whether or not the components have contact can be graphically represented for a user with specification of the position of the component on the wafer. For example, the representation can be on an image of the wafer where the test system 60 has a display device 61 indicating a colored (green) dot at the position of a component with good contact and a differently colored (red) dot at the position of a component without contact. Thus, it is immediately evident from such a representation whether or not the entire wafer has good contact with the needle card.

In the event of incomplete contact, the type of incorrect contact can easily be inferred from the pattern of components with and without contact. In particular, the following types of incorrect contact can be identified:

Misalignment—the wafer is not correctly aligned and the component terminals are not congruent with the needle card terminals. Such a condition may be caused by dirty alignment markings, for example;

Open contact for in each case one fixed terminal per component;

Severe local contamination of the contacting card (needle card) or wafer;

Different thermal expansion of wafer and contacting card; and

Inadequate vacuum or inadequate contact pressure before the beginning of the measurements.

In contrast, absent contacts of individual signals can only be checked by a functional test. However, the advantage of the method according to the invention is that there is no need for a complicated test unit for functional tests for checking the contact quality. Rather, the contact test can be carried out after alignment (alignment and contact-connection of wafer and needle card) in a simple off-line station.

We claim:

1. A method for checking releasable contacts of integrated semiconductor modules on a wafer, the semiconductor modules each having interconnected supply voltage terminals, which comprises:

connecting the contacts of a semiconductor module on the wafer in parallel with a contacting card;

applying a supply voltage to a first one of the supply voltage terminals of the semiconductor module through the contacting card;

measuring a voltage present at a second one of the supply voltage terminals of the semiconductor module through the contacting card;

comparing the voltage applied to the first supply voltage terminal with the voltage measured at the second supply voltage terminal; and evaluating a contact status for the semiconductor module as being correct if the voltage measured at the second supply voltage terminal substantially corresponds to the voltage applied to the first supply voltage terminal, and otherwise as being incorrect.

2. The method according to claim 1, which further comprises indicating the evaluation of the semiconductor module with an indication device.

3. The method according to claim 1, which further comprises repeating the connecting, applying, measuring, comparing, and evaluating steps for each of the semiconductor modules.

4. The method according to claim 3, which further comprises simultaneously indicating the evaluation of the semiconductor modules with an indication device.

5. The method according to claim 3, which further comprises simultaneously indicating the evaluation of all of the semiconductor modules with an indication device.

6. The method according to claim 1, which further comprises indicating a result of the evaluation for a given semiconductor module with a representation indicating a position of the respective semiconductor module on the wafer.

7. The method according to claim 3, which further comprises simultaneously indicating a result of the evaluation for all of the semiconductor modules with a representation indicating a position of each respective semiconductor module on the wafer.

8. The method according to claim 1, wherein:

the contacts of the semiconductor modules are terminal pads; and the contacting card has contact elements; and which further comprises forming a releasable electrical connection between the terminal pads of the semiconductor module and the contacting card with intermediate elements disposed on the contact elements.

9. The method according to claim 8, which further comprises forming the releasable electrical connection with contact-connecting needles.

10. The method according to claim 1, wherein:

the contacts of the semiconductor modules are terminal pads; and the contacting card has contact elements; and which further comprises forming a releasable electrical connection between the terminal pads of the semiconductor module and the contacting card with intermediate elements disposed on the terminal pads.

11. The method according to claim 10, which further comprises forming the releasable electrical connection with contact-connecting needles.

12. The method according to claim 1, which further comprises checking a contact quality by applying to the supply voltage terminals a voltage corresponding to the supply voltage.

13. The method according to claim 1, which further comprises measuring a voltage present at a further one of the supply voltage terminals in a substantially currentless manner through one of a read contact-connecting needle and a read intermediate element.

14. A method for checking releasable contacts of integrated semiconductor modules on a wafer, the semiconductor modules each having interconnected supply voltage terminals, which comprises:

connecting the contacts of a semiconductor module on the wafer in parallel with a contacting card;

applying a voltage to a first one of the supply voltage terminals of the semiconductor module through the contacting card;

measuring a voltage present at a second one of the supply voltage terminals of the semiconductor module through the contacting card;

comparing the voltage applied to the first supply voltage terminal with the voltage measured at the second supply voltage terminal; and evaluating a contact status for the semiconductor module as being correct if the voltage measured at the second supply voltage terminal substantially corresponds to the voltage applied to the first supply voltage terminal, and otherwise as being incorrect; and repeating the connecting, applying, measuring, comparing, and evaluating steps for each of the semiconductor modules.

15. The method according to claim 14, which further comprises indicating the evaluation of the semiconductor module with an indication device.

16. The method according to claim 14, which further comprises simultaneously indicating the evaluation of all of the semiconductor modules with an indication device.

17. The method according to claim 14, which further comprises indicating a result of the evaluation for a given semiconductor module with a representation indicating a position of the respective semiconductor module on the wafer.

18. The method according to claim 14, which further comprises simultaneously indicating a result of the evaluation for all of the semiconductor modules with a representation indicating a position of each respective semiconductor module on the wafer.

19. The method according to claim 14, wherein:

the contacts of the semiconductor modules are terminal pads; and the contacting card has contact elements; and which further comprises forming a releasable electrical connection between the terminal pads of the semiconductor module and the contacting card with intermediate elements disposed on the contact elements.

20. The method according to claim 19, which further comprises forming the releasable electrical connection with contact-connecting needles.

21. The method according to claim 14, wherein:

the contacts of the semiconductor modules are terminal pads; and the contacting card has contact elements; and which further comprises forming a releasable electrical connection between the terminal pads of the semiconductor module and the contacting card with intermediate elements disposed on the terminal pads.

22. The method according to claim 21, which further comprises forming the releasable electrical connection with contact-connecting needles.

23. The method according to claim 14, which further comprises checking a contact quality by applying to the supply voltage terminals a voltage corresponding to the supply voltage.

24. The method according to claim 14, which further comprises measuring a voltage present at a further one of the supply voltage terminals in a substantially currentless manner through one of a read contact-connecting needle and a read intermediate element.

25. A method for checking releasable contact connection of integrated semiconductor modules on a wafer, each of the modules having interconnected supply voltage terminals, which comprises:

applying external electrical signals to a semiconductor module through contact elements of a contacting card by aligning the contacting card with the semiconductor module on the wafer and releasably contacting the contact elements of the contacting card to terminal pads of the semiconductor module;

checking a contact quality of the semiconductor module by applying a voltage to at least one supply voltage terminal of the semiconductor module through the contacting card;

measuring a voltage present at another supply voltage terminal of the semiconductor module through the contacting card; and determining if the semiconductor module has correct contact based upon a result of the measurement.

26. The method according to claim 25, which further comprises repeating the applying, checking, measuring, and determining steps for each of the semiconductor modules.

* * * * *